(12) United States Patent
Nishide

(10) Patent No.: US 6,522,159 B1
(45) Date of Patent: Feb. 18, 2003

(54) SHORT-CIRCUIT FAILURE ANALYZING METHOD AND APPARATUS

(75) Inventor: Kenzo Nishide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/644,216

(22) Filed: Aug. 23, 2000

(30) Foreign Application Priority Data

Dec. 6, 1999 (JP) ............................................. 11-345739

(51) Int. Cl.[7] .............................................. G01R 31/28
(52) U.S. Cl. ...................................... 324/765; 324/537
(58) Field of Search ................................ 324/765, 537; 714/724, 736, 738, 741

(56) References Cited

U.S. PATENT DOCUMENTS

| | | | | |
|---|---|---|---|---|
| 5,790,565 A | * | 8/1998 | Sakaguchi | .................. 714/738 |
| 5,944,847 A | * | 8/1999 | Sanada | ........................ 714/741 |
| 6,173,426 B1 | * | 1/2001 | Sanada | ........................ 714/724 |

FOREIGN PATENT DOCUMENTS

| | | |
|---|---|---|
| JP | 7-49363 | 2/1995 |
| JP | 9-197014 | 7/1997 |
| JP | 9-292444 | 11/1997 |
| JP | 10-19986 | 1/1998 |

* cited by examiner

*Primary Examiner*—Ernest Karlsen
(74) *Attorney, Agent, or Firm*—Staas & Halsey LLP

(57) ABSTRACT

A setting of a logical state in an integrated circuit is changed, a plurality of measurement patterns which are used in a quiescent power source current test of the integrated circuit are formed, an internal state value 0/1 of each net at the time when the measurement patterns are supplied by a simulation of the integrated circuit is derived, and further, a pass or fail test result is obtained every measurement pattern by the quiescent power source current test in which a plurality of measurement patterns were supplied to the integrated circuit determined to be a defective device. A state value variable in which the internal state values of all measurement patterns have been stored every net and a test result variable in which the pass or fail test result has been stored every measurement pattern are formed on the basis of those measurement patterns, internal state values, and test results. A combination of the state value variable of each net and the test result variable are compared between the nets, thereby discriminating a short-circuit failure position in the integrated circuit.

8 Claims, 17 Drawing Sheets

FIG. 3

| PAT# | 1 | 2 | 3 | 4 | 5 | 6 | | VARIABLE |
|---|---|---|---|---|---|---|---|---|
| 01 | 0 | 0 | 0 | 1 | 1 | 0 | = | netdata_1 |
| 02 | 0 | 1 | 0 | 1 | 0 | 0 | = | netdata_2 |
| 03 | 0 | 1 | 1 | 0 | 0 | 0 | = | netdata_3 |
| 04 | 1 | 0 | 1 | 0 | 1 | 1 | = | netdata_4 |
| 05 | 0 | 0 | 1 | 1 | 0 | 1 | = | netdata_5 |
| 06 | 0 | 1 | 0 | 1 | 0 | 0 | = | netdata_6 |
| 07 | 0 | 1 | 1 | 0 | 1 | 0 | = | netdata_7 |
| 08 | | | | | | | = | netdata_8 |
| pass/fail | P | P | F | F | F | P | = | passdata |
| | (1 | 1 | 0 | 0 | 0 | 1) | | |

NET#

| PAT# | 1 | 2 | 3 | 4 | 5 | 6 | | VARIABLE |
|---|---|---|---|---|---|---|---|---|
| BLOCK#1 | | | | | | | | |
| 01 | 0 | 0 | 0 | 0 | 0 | 0 | = | netdata_1 & passdata |
| 06 | 0 | 0 | 0 | 0 | 0 | 0 | = | netdata_6 & passdata |
| BLOCK#2 | | | | | | | | |
| 04 | 0 | 0 | 0 | 0 | 0 | 1 | = | netdata_4 & passdata |
| BLOCK#3 | | | | | | | | |
| 02 | 0 | 1 | 0 | 0 | 0 | 0 | = | netdata_2 & passdata |
| 03 | 0 | 1 | 0 | 0 | 0 | 0 | = | netdata_3 & passdata |
| 08 | 0 | 1 | 0 | 0 | 0 | 0 | = | netdata_8 & passdata |
| BLOCK#4 | | | | | | | | |
| 05 | 1 | 0 | 0 | 0 | 0 | 1 | = | netdata_5 & passdata |
| BLOCK#5 | | | | | | | | |
| 07 | 0 | 1 | 0 | 0 | 0 | 1 | = | netdata_7 & passdata |

NET#

FIG. 5

| PAT# | 1 | 2 | 3 | 4 | 5 | 6 | | VARIABLE |
|---|---|---|---|---|---|---|---|---|
| BLOCK#1 | | | | | | | | |
| 01 | 0 | 0 | 0 | 1 | 1 | 0 | = | netdata_1 & ¬passdata = A1 |
| 06 | 0 | 0 | 0 | 1 | 0 | 0 | = | netdata_6 & ¬passdata = A6 |
| 01 | 0 | 0 | 1 | 0 | 0 | 0 | = | ¬netdata_1 & ¬passdata = B1 |
| 06 | 0 | 0 | 1 | 0 | 1 | 0 | = | ¬netdata_6 & ¬passdata = B6 |
| BLOCK#2 | | | | | | | | |
| 04 | 0 | 0 | 1 | 0 | 1 | 0 | = | netdata_4 & passdata |
| BLOCK#3 | | | | | | | | |
| 02 | 0 | 0 | 0 | 1 | 0 | 0 | = | netdata_2 & ¬passdata = A2 |
| 03 | 0 | 0 | 1 | 0 | 0 | 0 | = | netdata_3 & ¬passdata = A3 |
| 08 | 0 | 0 | 1 | 0 | 1 | 0 | = | netdata_8 & ¬passdata = A8 |
| 02 | 0 | 0 | 1 | 0 | 1 | 0 | = | ¬netdata_2 & ¬passdata = B2 |
| 03 | 0 | 0 | 0 | 1 | 1 | 0 | = | ¬netdata_3 & ¬passdata = B3 |
| 08 | 0 | 0 | 0 | 1 | 0 | 0 | = | ¬netdata_8 & ¬passdata = B8 |
| BLOCK#4 | | | | | | | | |
| 05 | 0 | 0 | 0 | 0 | 0 | 0 | = | ¬netdata_5 & passdata |
| BLOCK#5 | | | | | | | | |
| 07 | 0 | 0 | 0 | 1 | 0 | 0 | = | netdata_7 & passdata |

NET#

30

| PAT# | 1 | 2 | 3 | 4 | 5 | 6 | | VARIABLE |
|---|---|---|---|---|---|---|---|---|
| 01 | 0 | 0 | 0 | 1 | 1 | 0 | = | netdata_1 |
| 02 | 0 | 1 | 0 | 1 | 0 | 0 | = | netdata_2 |
| 03 | 0 | 1 | 1 | 0 | 0 | 0 | = | netdata_3 |
| 04 | 1 | 0 | 1 | 0 | 1 | 1 | = | netdata_4 |
| 05 | 0 | 0 | 0 | 0 | 0 | 1 | = | netdata_5 |
| 06 | 0 | 1 | 0 | 1 | 0 | 0 | = | netdata_6 |
| 07 | 0 | 0 | 1 | 0 | 0 | 0 | = | netdata_7 |
| 08 | 0 | 1 | 0 | 1 | 1 | 0 | = | netdata_8 |
| 09 | 0 | 0 | 1 | 1 | 1 | 0 | = | netdata_9 |
| 10 | 0 | 1 | 0 | 1 | 0 | 0 | = | netdata_10 |
| pass/fail | P | P | F | F | F | P | = | passdata |
| | ( 1 | 1 | 0 | 0 | 0 | 1 ) | | |

NET#

FIG. 7B

| PAT# | 1 | 2 | 3 | 4 | 5 | 6 | | VARIABLE | GROUP No. |
|---|---|---|---|---|---|---|---|---|---|
| 01 | 0 | 0 | 0 | 1 | 1 | 0 | = | netdata_1 | G1 |
| 09 | 0 | 0 | 0 | 1 | 1 | 0 | = | netdata_9 | |
| 02 | 0 | 1 | 0 | 1 | 0 | 0 | = | netdata_2 | G2 |
| 10 | 0 | 1 | 0 | 1 | 0 | 0 | = | netdata_10 | |
| 03 | 0 | 1 | 1 | 0 | 0 | 0 | = | netdata_3 | G3 |
| 04 | 0 | 0 | 1 | 0 | 1 | 1 | = | netdata_4 | G4 |
| 05 | 1 | 0 | 1 | 0 | 0 | 1 | = | netdata_5 | G5 |
| 06 | 0 | 0 | 0 | 1 | 0 | 0 | = | netdata_6 | G6 |
| 07 | 0 | 1 | 1 | 1 | 1 | 0 | = | netdata_7 | G7 |
| 08 | 0 | 1 | 0 | 0 | 0 | 0 | = | netdata_8 | G8 |
| pass/fail | P | P | F | F | F | P | = | passdata | |
| | (1 | 1 | 0 | 0 | 0 | 1) | | | |

NET#

| PAT# | 1 | 2 | 3 | 4 | 5 | 6 |   | VARIABLE |
|------|---|---|---|---|---|---|---|----------|
| 01 | 0 | 0 | 0 | 1 | 1 | 0 | = | netdata_1 |
| 02 | 0 | 1 | 0 | 1 | Z=0 | 0 | = | netdata_2 |
| 03 | 0 | 1 | 1 | 0 | 0 | 0 | = | netdata_3 |
| 04 | 0 | 0 | 1 | 0 | 1 | 1 | = | netdata_4 |
| 05 | 1 | 0 | 1 | 0 | 0 | 1 | = | netdata_5 |
| 06 | 0 | 0 | 0 | X=1 | 0 | 0 | = | netdata_6 |
| 07 | 0 | 1 | 1 | 1 | 0 | 0 | = | netdata_7 |
| 08 | 0 | 1 | 0 | 0 | 1 | 0 | = | netdata_8 |
| pass/fail | P | P | F | F | F | F | = | passdata |
|  | (1 | 1 | 0 | 0 | 0 | 1) |  |  |

NET#

| PAT# | 1 | 2 | 3 | 4 | 5 | 6 | | VARIABLE |
|---|---|---|---|---|---|---|---|---|
| 01 | 1 | 1 | 1 | 1 | 0 | 1 | = | maskdata_1 |
| 02 | 1 | 1 | 1 | 1 | 1 | 1 | = | maskdata_2 |
| 03 | 1 | 1 | 1 | 1 | 1 | 1 | = | maskdata_3 |
| 04 | 1 | 1 | 1 | 1 | 1 | 1 | = | maskdata_4 |
| 05 | 1 | 1 | 1 | 0 | 1 | 1 | = | maskdata_5 |
| 06 | 1 | 1 | 1 | 1 | 1 | 1 | = | maskdata_6 |
| 07 | 1 | 1 | 1 | 1 | 1 | 1 | = | maskdata_7 |
| 08 | 1 | 1 | 1 | 1 | 1 | 1 | = | maskdata_8 |

NET#

42

SHORT-CIRCUIT FAILURE ANALYZING METHOD AND APPARATUS

BACKGROUND OF THE INVENTION

1. Field of the Invention

The present invention relates to short-circuit failure analyzing method and apparatus for specifying a position where a short-circuit failure occurs in an integrated circuit such as LSI, VLSI, or the like and, more particularly, to short-circuit failure analyzing method and apparatus which can process a failure analysis at a high speed even in a large scale integrated circuit.

2. Description of the Related Arts

Hitherto, an analysis of a failure in an integrated circuit determined as a defective device is performed mainly on the basis of a result of a function test and a failure simulation. In the conventional failure analysis, however, since it is performed on the assumption of a fixed failure of 0/1, in many cases, a failure analysis to specify a failure position cannot be performed with respect to the short-circuit failure in a wiring or a transistor.

On the other hand, in a CMOS LSI, generally, although a power source/current hardly flows in a state where an internal circuit is not operated, if there is a short-circuit failure, a fail current flows between a power source and the ground. There is a quiescent power source current test (Iddq test) to analyze the short-circuit failure by using such a nature. According to the failure analysis by the quiescent power source current test, failure positions are narrowed down to hundreds of gates or less by another means and, after that, they are analyzed. According to the failure analysis by the quiescent power source current test, however, when the number of gates is increased, the number of nets is also increased enormously. The failure analysis requires a long time and, in addition, when the scale is enlarged, the analysis cannot be performed.

SUMMARY OF THE INVENTION

According to the invention, there are provided short-circuit failure analyzing method and apparatus which can analyze even a large scale integrated circuit having millions of gates or more and can analyze it at a high speed.

A short-circuit failure analyzing method of the invention has a procedure comprising: a measurement pattern forming step; an internal state value deriving step; a testing step; a variable forming step; and a discriminating step. In the measurement pattern forming step, a setting of an internal logical state of an integrated circuit is changed and a plurality of measurement patterns to be used for a quiescent power source current test (Iddq test) are formed. In the internal state value deriving step, an internal state value 0/1 for each net at the time when the measurement pattern is supplied due to a simulation of the integrated circuit is derived. In the testing step, a plurality of measurement patterns are supplied to the integrated circuit determined as a defective device, a quiescent power source current (Iddq) is measured, and a pass or fail test result is obtained for each measurement pattern. In the variable forming step, on the basis of the measurement patterns, and the internal state value and test result of each net, a state value variable (netdata_n) in which the internal state values of all of the measurement patterns have been stored every net (net number n) and a test result variable (passdata) in which the pass or fail test result has been stored every measurement pattern are formed. In the discriminating step, the state value variable (netdata_n) and the test result variable (passdata) for each net are compared, thereby discriminating a combination of the short-circuited nets in the integrated circuit as a failure position. As mentioned above, according to the invention, the logical state values in all of the measurement patterns of each net due to the simulation are substituted into one state value variable (netdata_n) on a net unit basis, results of the quiescent power source current tests of all of the nets in all of the measurement patterns are substituted into another test result variable (passdata), a combination test result variable (passdata) of the internal state value variable (netdata_n) of each net is combined, and resultant variables are compared between the nets, so that the short-circuit failure position can be specified. In the comparison of the combined variables, since it is sufficient to mutually compare them among all of the nets, when the number of nets is assumed to be (n), they are compared by a league match system (round robin system). In principle, the number of times of comparison is equal to up to $(n^2-n)/2$. Accordingly, even a large scale integrated circuit having millions of gates or more can be analyzed at a high speed.

The discriminating step includes a pass pattern comparing step and a fail pattern comparing step. In the pass pattern comparing step, a pass pattern (pass pattern P_n) of each net is obtained as a combination of the variables by the AND of the state value variable (netdata_n) and the test result variable (passdata) of each net. It is presumed that the short-circuit position exists between the nets whose pass patterns have the same logical value (P_A=P_B).

In the pass pattern, although a fail current does not flow in the quiescent power source current test, this is because the short-circuited nets have the same logical value. Therefore, the short-circuit failure exists between the nets having the same logical value in the pass pattern.

In the fail pattern comparing step, with respect to each net in which the existence of the short-circuit failure has been presumed in the pass pattern comparing step, a first fail pattern (F_A) of each net is obtained by the AND of the state value variable (netdata_n) of the net and an inverted value (passdata) of the test result variable, a second fail pattern (F_B) of each net is obtained by the AND of an inverted value (netdata_n) of the state value variable of each net and the inverted value (passdata) of the test result variable, it is presumed that a short-circuit position exists between two nets in which their first fail patterns and the second fail patterns of the two nets mutually have the same logical value (F_A=F_B), and a presumption result is outputted. In the fail pattern, although a fail current flows in the quiescent power source current test, this is because the mutual short-circuited nets have the opposite logical values. Therefore, a short-circuit failure exists between the nets in which parts or the whole portions in the fail pattern have the opposite logical values. That is, the short-circuit failure exists between the two nets in which the first fail pattern and the second fail pattern are the same.

In the variable forming step, the state value variables having the same value of a plurality of nets are collected into one group. In this case, in the discriminating step, one of the state value variables of an arbitrary representative net is selected from the grouped variables and a short-circuit failure is discriminated. In this manner, by grouping the same state value variables, the number of combination variables to be used for comparison can be reduced to a value smaller than the number of nets and the processing speed can be raised. In the variable forming step, when an unsteady state X or a high impedance state Z is included in the internal state of each net, in addition to the state value variable (netdata_n) of each net, a mask variable (maskdata_n) in which the logical value "1" has been stored in the fixed state of the state value variable and the logical value "0" has been stored in the unsteady state X or high impedance state Z is formed. In this case, in the discriminating step, combinations of the state value variable (netdata_n) of each net, mask variable (maskdata_n) of each net, and test result variable (passdata) are compared, thereby determining the short-circuit position in the integrated circuit. Also in this case, the comparison discriminating step has a pass pattern comparing step and a fail pattern comparing step. In the pass pattern comparing step, a pass pattern (passpattern P_n) for each net is obtained from the AND of the state value variable (netdata_n), mask variable (maskdata_n), and test result variable (passdata) of each net, thereby presuming that a short-circuit position exists between the nets whose pass patterns have the same logical value (P_A=P_B).

In the fail pattern comparing step, as for a plurality of nets in each of which the existence of the short-circuit failure obtained in the pass pattern comparing step has been presumed, a first fail pattern (F_A) of each net is obtained by the AND of the state value variable (netdata_n) of each net, its own and comparison destination's mask variables (maskdata_n) of each net, and an inverted value (passdata) of the test result variable, a second fail pattern (F_B) of each net is obtained by the AND of the inverted value (netdata_n) of the state value variable of each net, its own and comparison destination's mask variables (maskdata_n) of each net, and the inverted value (passdata) of the test result variable, it is presumed that a short-circuit position exists between two nets in which the first and second fail patterns have the same logical value (F_A=F_B), and a presumption result is outputted.

In the variable forming step, also with respect to the case where the unsteady state X or high impedance state Z is included in the internal state of each net, the state value variables of a plurality of nets having the same value are collectively grouped. In the discriminating step, one of the grouped state value variables is selected and the short-circuit failure is determined, thereby realizing the high processing speed. According to the invention as mentioned above, even when the unsteady state X or high impedance state Z is included in the internal state of each net, the short-circuit failure can be analyzed.

According to the short-circuit failure analyzing method of the invention, when it is necessary to further converge the short-circuit failure positions obtained in the discriminating step, in the measurement pattern forming step, a measurement pattern of the quiescent power source current test in which the failure position serving as a target of convergence can be separated is formed, and the internal state value deriving step, testing step, comparing step, and discriminating step are again executed, thereby specifying the short-circuit failure position. Further, whether the short-circuit failure position is close enough to be short-circuited or not is discriminated for the converged short-circuit failure positions with reference to the position information of the wirings, so that the short-circuit failure positions are further converged. The short-circuit position can be accurately determined by such a convergence of the short-circuit failure.

According to the present invention, there is also provided a short-circuit failure analyzing apparatus comprising: a measurement pattern forming unit for changing a setting of a logical state and forming a plurality of measurement patterns to be used for a quiescent power source current test of an integrated circuit; an internal state value deriving unit for deriving an internal state value of each net when the measurement pattern is supplied by simulation of the integrated circuit; a testing unit for supplying a plurality of measurement patterns to the integrated circuit determined as a defective device, measuring a quiescent power source current, and obtaining a pass or fail test result every measurement pattern; a variable forming unit for forming a state value variable in which internal state values of all of the measurement patterns have been stored every net and a test result variable in which the pass or fail test result has been stored every measurement pattern on the basis of the measurement patterns, internal state value of each net, and test result; and a discriminating unit for comparing the state value variable of each net with the test result variable and determining a combination of the short-circuited nets in the integrated circuit as a failure position. The details of the short-circuit failure analyzing apparatus are fundamentally the same as those of the short-circuit failure analyzing method.

The above and other objects, features, and advantages of the present invention will become more apparent from the following detailed description with reference to the drawings.

BRIEF DESCRIPTION OF THE DRAWINGS

FIG. 3 is an explanatory diagram of a variable forming table which is used in a variable forming process of the invention;

FIG. 4 is an explanatory diagram of a short-circuit failure discriminating process by a comparison of pass patterns obtained by combining variables in FIG. 3;

FIG. 5 is an explanatory diagram of the short-circuit failure discriminating process by a comparison of fail patterns obtained by combining variables in FIG. 3 which is performed subsequently to the process of FIG. 4;

FIGS. 7A and 7B are explanatory diagrams of the variable forming process of the invention for grouping the nets of the same values;

FIGS. 9A and 9B are explanatory diagrams of the variable forming process of the invention in the case where an unsteady state X and a high impedance state Z are included;

DETAILED DESCRIPTION OF THE PREFERRED EMBODIMENT

Figure 1:
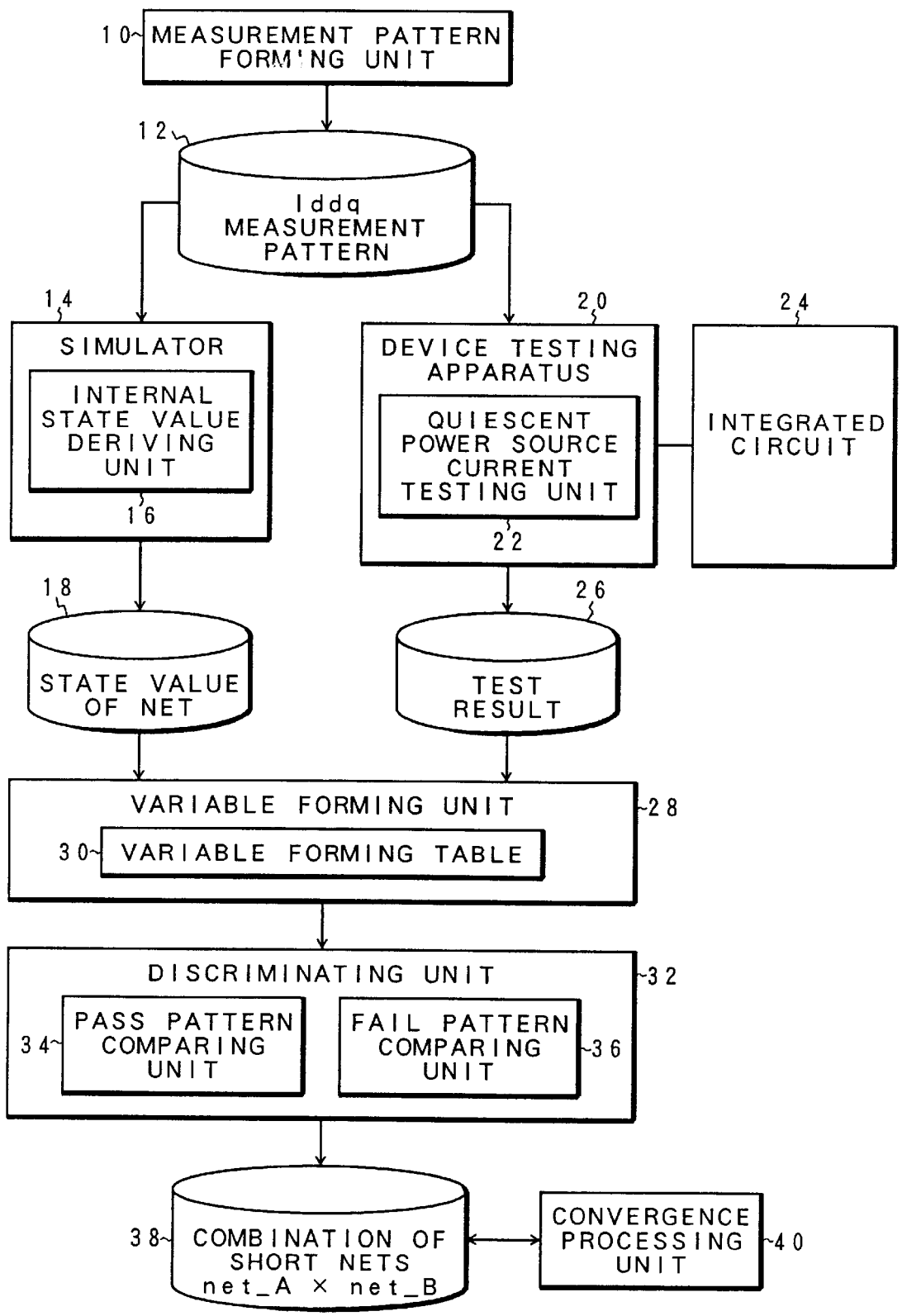
FIG. 1 is a functional block diagram of a short-circuit failure analyzing apparatus according to the invention.

FIG. 1 is a block diagram of a functional construction of a short-circuit failure analyzing apparatus according to the invention. The short-circuit failure analyzing apparatus according to the invention comprises: a measurement pattern forming unit 10; a simulator 14 having an internal state value deriving unit 16; and a device testing apparatus 20 having a quiescent power source current testing unit (Iddq testing unit) 22. The following information necessary for a short-circuit analysis of the invention is prepared by the measurement pattern forming unit 10, internal state value deriving unit 16, and quiescent power source current testing unit 22.

(1) Quiescent power source current measurement pattern (Iddq measurement pattern)
(2) State value of an internal net
(3) Test result of a defective device The measurement pattern forming unit 10 forms an Iddq measurement pattern 12. That is, the measurement pattern forming unit 10 changes a setting of a logical state of an I/O, an internal flip-flop, or the like by using design data about an integrated circuit 24 which has been determined to be a defective device and is a target of the short-circuit failure analysis and forms a plurality of measurement patterns for a quiescent power source current test. By forming the plurality of Iddq measurement patterns as mentioned above, a detection ratio of the short-circuit failure analysis can be raised. The internal state value deriving unit 16 provided in the simulator 14 derives the state value of the internal net of the integrated circuit 24 at the time of supplying the Iddq measurement pattern 12 by a simulation. An internal state value which is derived by the simulation includes an unsteady state X in which an internal state is not decided and a high impedance state Z besides a decision state of 0 or 1. According to the fundamental short-circuit failure analyzing process of the invention, the decision state of 0 or 1 is used as a target for the internal state value. According to a modification of the invention, the internal state can also cope with a case of including the unsteady state X and high impedance state Z in addition to the decision state 0 or 1. By supplying the Iddq measurement pattern by setting the integrated circuit 24 determined as a defective device to a measurement target, the quiescent power source current testing unit 22 provided for the device testing apparatus 20 obtains a pass or fail test result every measurement pattern. That is, in the Iddq test by the quiescent power source current testing unit, in a quiescent state where the inside of the circuit to which each of the Iddq measurement patterns has been applied does not operate, a current flowing between the power source and the ground is detected. If there is a short-circuit failure, since a fail current flows between the power source and the ground, this fail current is detected and a test result is set to "fail". However, even if there is a short-circuit failure, there is a case where the fail current due to the short-circuit failure is not generated in dependence on the logical state of an internal unit. In this case, the test result is set to "pass". The state value of the net derived by the simulator 14 is stored in a net state value storing file 18. The test result of the Iddq test of the quiescent power source current testing unit 22 is stored in a test result file 26. Those values and result are prepared as information necessary for the short-circuit failure analyzing process according to the invention. Obviously, the Iddq measurement pattern formed by the measurement pattern forming unit 10 has been stored in an Iddq measurement pattern storing file 12. Since the short-circuit failure is analyzed by using the net state value and test result of the Iddq test which were prepared in the files 18 and 26, a variable forming unit 28 and a discriminating unit 32 are provided. The variable forming unit 28 has a variable forming table 30 and forms a state value variable (netdata_n) in which the internal state values of all of the Iddq measurement patterns have been stored every net and a test result variable (passdata) in which the pass or fail test result has been stored every Iddq measurement pattern on the basis of the net state value and the test result of the Iddq test. The discriminating unit 32 forms, every net, a logical value in which the state value variable (netdata_n) of each net and the test result variable (passdata) which were formed on the variable forming table 30 of the variable forming unit 28 are combined and mutually compares them between the nets, thereby discriminating the combination of the short-circuited nets of the integrated circuit 24 serving as the defective device as a failure position and stores it into an analysis result storing file 38. For this purpose, the discriminating unit 32 has a pass pattern comparing unit 34 and a fail pattern comparing unit 36. The pass pattern comparing unit 34 obtains a pass pattern (P_n) every net by the AND of each state value variable (netdata_n) of each net and the test result variable (passdata) and presumes that a short-circuited position exists between two nets whose pass patterns have the same logical value (P_A=P_B). With respect to a plurality of nets in which the existence of the short-circuit failure was presumed by the pass pattern comparing unit 34 as targets, the fail pattern comparing unit 36 obtains the first fail pattern (F_A) of each net by the AND of each of the state value variables (netdata_n) of each net and the inverted value (passdata) of the test result variable (passdata), obtains the second fail pattern (F_B) of each net by the AND of each inverted value (netdata_n) of the state value variable (netdata_n) of each net and the test result variable (passdata), presumes that a short-circuit failure exists between the nets in which the two patterns of the first fail pattern and the second fail pattern of the two nets have the same value (F_A=F_B), and outputs a combination of the short-circuited nets as a presumption result. A convergence processing unit 40 is provided to further converge the failure positions with respect to the combination of the short-circuited nets stored in an analysis result storing file 38. The converging process of the failure positions by the convergence processing unit 40 is selectively performed as necessary and its details will be clarified in the following explanation.

Figure 2:
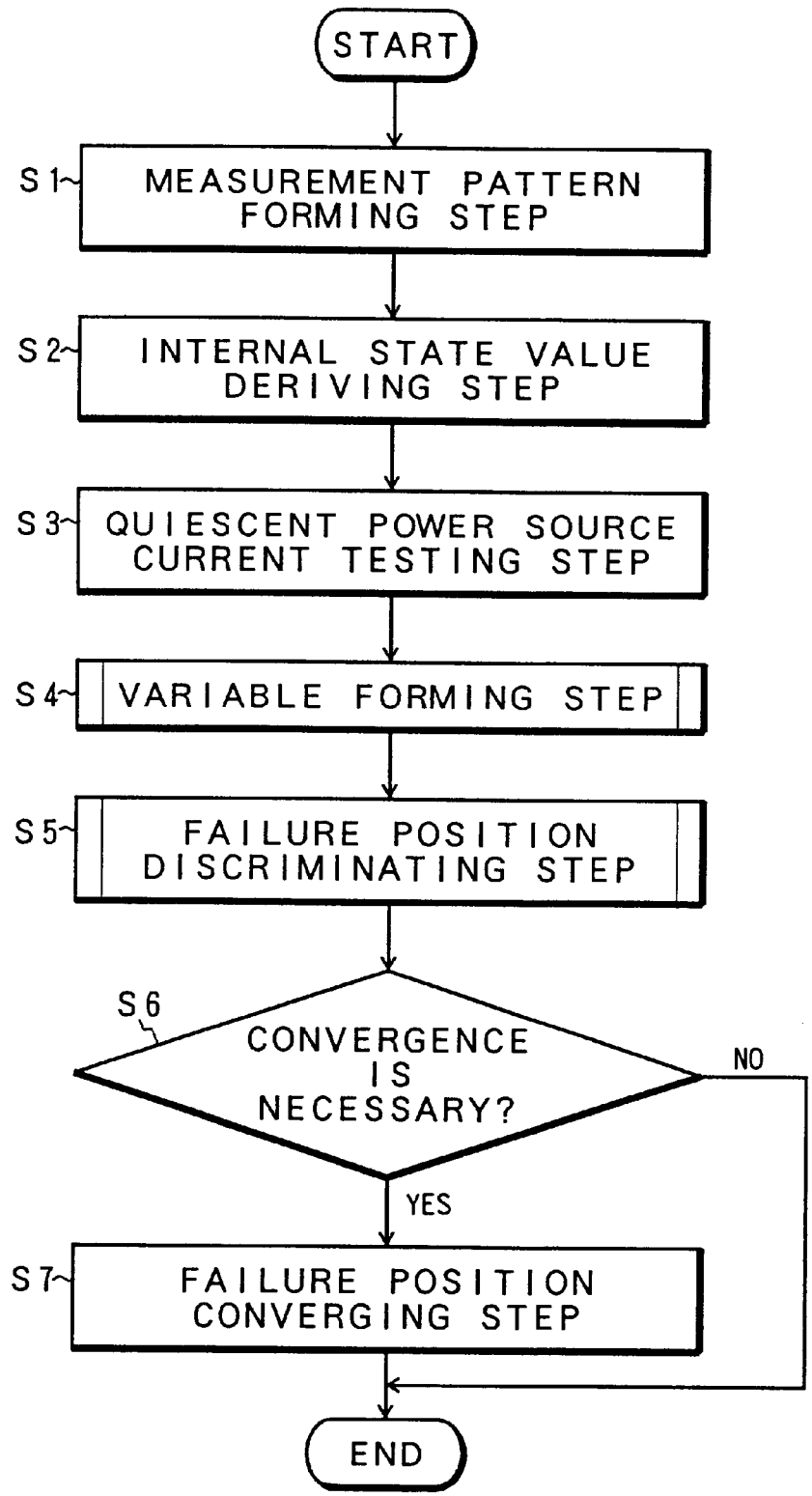
FIG. 2 is a flowchart for a processing procedure of a short-circuit failure analyzing method according to the invention.

FIG. 2 is a flowchart showing a fundamental processing procedure of the short-circuit failure analyzing method according to the invention. First, in a measurement pattern forming process in step S1, with respect to the integrated circuit 24 which was determined to be a defective device and is set to a target of a failure diagnosis, a plurality of measurement patterns which are used to perform a quiescent power source current test by the device testing apparatus 20 as shown in FIG. 1 are formed. Subsequently, in an internal state value deriving process in step S2, internal state values (0, 1; or 0, 1, X, Z) of each net in the case where the Iddq measurement pattern is supplied by the simulator 14 in FIG. 1 are derived. In a quiescent power source current testing process in step S3, as shown in the device testing apparatus 20 in FIG. 2, the integrated circuit 24 which was determined to be a defective device is used as a measurement target, a plurality of Iddq measurement patterns are supplied, quiescent power source currents are measured, and a pass or fail test result is obtained every measurement pattern. In the processes in steps S1 to S3, the information necessary for analysis of the short-circuit failure is prepared. Subsequently, in a variable forming process in step S4, the state value variable (netdata_n) in which the internal state values of all of the measurement patterns have been stored every net and the test result variable (passdata) in which the pass or fail test result has been stored every measurement pattern are formed on the basis of the Iddq measurement pattern, internal state value, and test result. In a failure position discriminating process in step S5, a combination of each of the formed state value variables (netdata_n) of each net and the test result variable (passdata) is compared every net, and a combination of the short-circuited nets in the integrated circuit is determined to be a failure position. In the process in the discriminating step, as shown in the discriminating unit 32 in FIG. 2, the presumption of the short-circuit failure position by the pass pattern comparing unit 34 and the presumption of the short-circuit failure position by the fail pattern comparing unit 36 subsequent thereto are performed. Subsequently, in step S6, if it is determined that a number of short-circuit failure positions exist and it is necessary to converge them with respect to the short-circuit failure position by the failure position discriminating process in step S5, the process advances to a failure position converging process in step S7, thereby converging the failure positions. The convergence of the failure positions can be performed by processes at the following two stages.

(1) The processing routine is returned to the process for forming the Iddq measurement pattern in step S1, an Iddq measurement pattern which can separate it is formed for the failure position remaining as an analysis result, and the processes in steps S1 to S5 are again repeated.

(2) The convergence by the new Iddq measurement patterns is performed as mentioned above. Whether the failure position is close enough to the converged failure position so as to be short-circuited or not is discriminated with reference to wiring position information of the design data of the integrated circuit 24 which is a defective device and is an analysis target, thereby converging them to the failure position which is close enough to be short-circuited.

The details of a short-circuit failure diagnosing process of the invention corresponding to the variable forming unit 28 and discriminating unit 32 in FIG. 1 and the variable forming process and failure position discriminating process in steps S4 and S5 in the flowchart of FIG. 2 will now be described.

FIG. 3 shows a specific example of the variable forming table 30 provided in the variable forming unit 28 in FIG. 1. In the variable forming table 30, six patterns of #=1 to 6 are shown in the upper lateral direction as patterns PAT# of the Iddq measurement patterns and #=01 to 08 is shown in the left vertical direction as net numbers NET# showing the nets of the integrated circuit as a diagnosis target. In the variable forming table 30, state value variables (netdata_1 to netdata_8) are set as sequentially shown in the right end vertical direction every net Nos. NET01 to NET08. 0 or 1 indicative of the internal state value obtained by the simulation is substituted into each bit of the state value variables (netdata_1 to netdata_8). As shown at the lower column right edge of the variable forming table 30, the test result variable (passdata) is set and "pass" or "fail" of the test result is substituted into each bit. In this case, "pass" is represented by "P" and "fail" is represented by "F". As a bit of the variable, "1" is substituted for "pass P" and "0" is substituted for "fail F".

If the variable forming table 30 can be formed as shown in FIG. 3, a discriminating process for discriminating the short-circuit failure position in the integrated circuit is performed by using the logical values of the state value variable (netdata_n) and test result variable (passdata) in the variable forming table 30.

FIG. 5 is an explanatory diagram of the discriminating process by the pass pattern comparing unit 34 in FIG. 1 in the discriminating process of the short-circuit failure position. In the discriminating process by the pass pattern comparing unit 34, a pass pattern is obtained with respect to each of the nets NET1 to NET8 and compared with the pass pattern between the nets, thereby discriminating. For example, two nets of a net A and a net B will now be described as follows. It is now assumed that a state value variable of the net A is equal to (netdata_A), a state value variable of the net B is equal to (netdata_B), and further, a test result variable is equal to (passdata), the pass pattern (P_A) of the net A and the pass pattern (P_B) of the net B are given by the following equations.

$$P\_A = netdata\_A \ \& \ passdata \tag{1}$$

$$P\_B = netdata\_B \ \& \ passdata \tag{2}$$

That is, the pass patterns (P_A, P_B) of the nets A and B are obtained as an AND of each of the state value variables (netdata_A) and (netdata_B) and the test result variable (passdata). When there is a relation of $$P\_A = P\_B \tag{3}$$

between the pass patterns (P_A) and (P_B), namely, when the logical values of the pass patterns of the two nets are equal, it is determined that there is a possibility that the nets A and B are short-circuited.

A comparison of the pass patterns will now be specifically explained with reference to FIG. 4. A variable arithmetic operation of the AND of the state value variables (netdata_1) to (netdata_8) and the test result variable (passdata) with respect to each of the nets NET01 to NET08 in FIG. 3 is shown on the right side of FIG. 4. Each pass pattern as an AND is shown on the left side. The net No. NET# and Iddq measurement pattern No. PAT# are shown on the left side. Further, in FIG. 4, the nets whose pass patterns have the same logical value are collectively grouped into blocks #1 to #5 and shown. That is, as shown in the block #1, the logical values of the pass patterns of the net Nos. 01 and 06 are the same. Therefore, it is determined that there is a possibility that there is a short-circuit between the nets of the net Nos. 01 and 06. In the block #3, three nets of the net Nos. 02, 03, and 08 are grouped as nets having the same logical values of the pass patterns, and it is determined that there is a possibility that there is a short-circuit among the three nets. As for the remaining blocks #2, #4, and #5, since there is only one net, namely, net Nos. 04, 05, and 07, there is no possibility of a short-circuit with respect to them.

FIG. 5 is an explanatory diagram of a fail pattern comparing process which is executed to the nets which were determined to be short-circuited in the pass pattern comparing process in FIG. 4. A principle of the fail pattern comparing process will now be described with respect to two nets of the nets A and B. First, assuming that the state variables of the nets A and B are set to (netdata_A) and (netdata_B), respectively, the first fail pattern (F_A) and the second fail pattern (F_B) are obtained with respect to each of the nets A and B by the following equations.

$$F\_A = netdata\_A \ \& \ \overline{passdata} \tag{4}$$

$$F\_B = netdata\_B \ \& \ \overline{passdata} \tag{5}$$

The first fail pattern (F_A) is the AND of the state value variable (netdata_A) of the net A and the inverted value ($\overline{passdata}$) of the test result variable (passdata). The second fail pattern (F_B) is the AND of the inverted value (netdata_B) of the state value variable (netdata_B) of the net B and the inverted value (passdata) of the test result variable (passdata). If $$(F\_A)=(F\_B) \quad (6)$$

is satisfied with respect to the first and second fail patterns obtained as mentioned above, there is a possibility that the nets A and B are short-circuited.

The discrimination of the short-circuit failure position by the comparison of the fail patterns will be specifically explained with reference to FIG. 5. In FIG. 5, in a manner similar to the comparing process of the pass pattern in FIG. 4, the nets other than the nets which were determined to be short-circuited in the blocks #1 and #3 are also shown. On the right side of FIG. 5, the AND of the first fail pattern and the second fail pattern is shown by a variable. In correspondence to the net Nos. 01 to 06, the first fail patterns are shown by A1 to A8 and the second fail patterns are shown by B1 to B8. However, since failure discrimination is not performed with respect to the blocks #2, #4, and #5 in which there is only one net in the block, the pattern codes are omitted. First, when seeing the block #1, the pass patterns A1 and A6 of the net Nos. 01 and 06 are obtained from the equation (4) and the fail patterns B1 and B6 of the net Nos. 01 and 06 are obtained from the equation (5). Even when the pass pattern A1 and fail pattern B6 are compared, they do not coincide and even when the pass pattern A6 and fail pattern B1 are compared, they do not coincide, so that there is no possibility that there is a short-circuit between the nets of the net Nos. 01 and 06. Subsequently, with respect to the nets having the net Nos. 02, 03, and 08 of the block #3, the pass patterns A2, A3, and A8 are obtained from the equation (4) and the fail patterns B2, B3, and B8 are obtained from the equation (5) in a manner similar to the above. In this case, the first pass pattern A2 and second fail pattern B8 have the same logical value "000100" and, at the same time, the first pass pattern A8 and second fail pattern B2 have the same logical value "001010". Therefore, there is a possibility that the nets of the net Nos. 02 and 08 are short-circuited. In such comparing processes by the fail patterns, in case of the fail pattern, a fail Iddq current flows in the net and it is because the mutual short-circuited nets have the opposite logical values. Therefore, a short-circuit failure exists between the nets in which the different patterns have the opposite logical values. Specifically speaking, as shown in FIG. 5, a short-circuit failure exists between the nets having the net Nos. 02 and 08 in which A2=B8 and A8=B2 in the block #3.

Figure 6A:
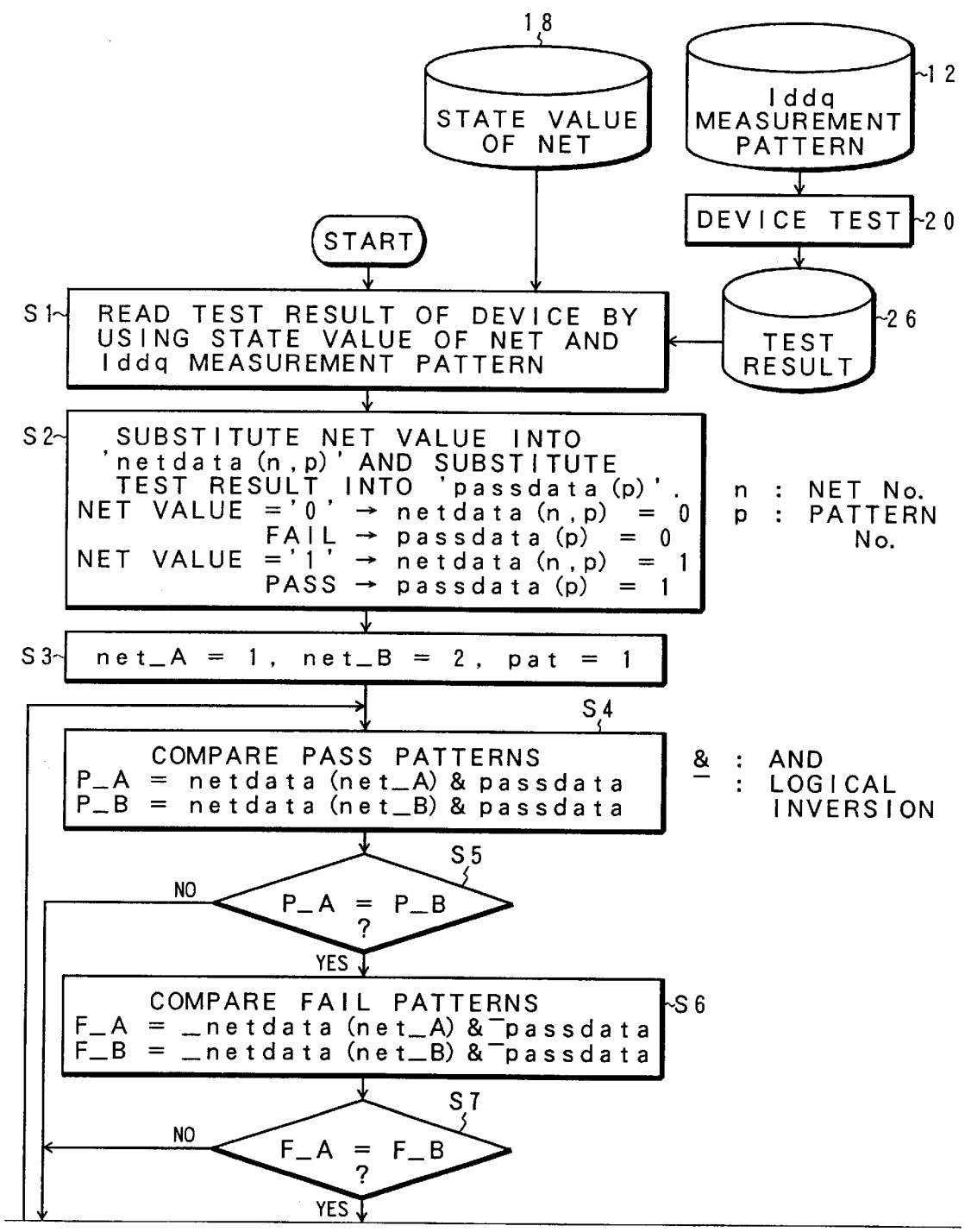
FIGS. 6A and 6B are flowcharts for the short-circuit failure analyzing method of the invention.
Figure 6B:
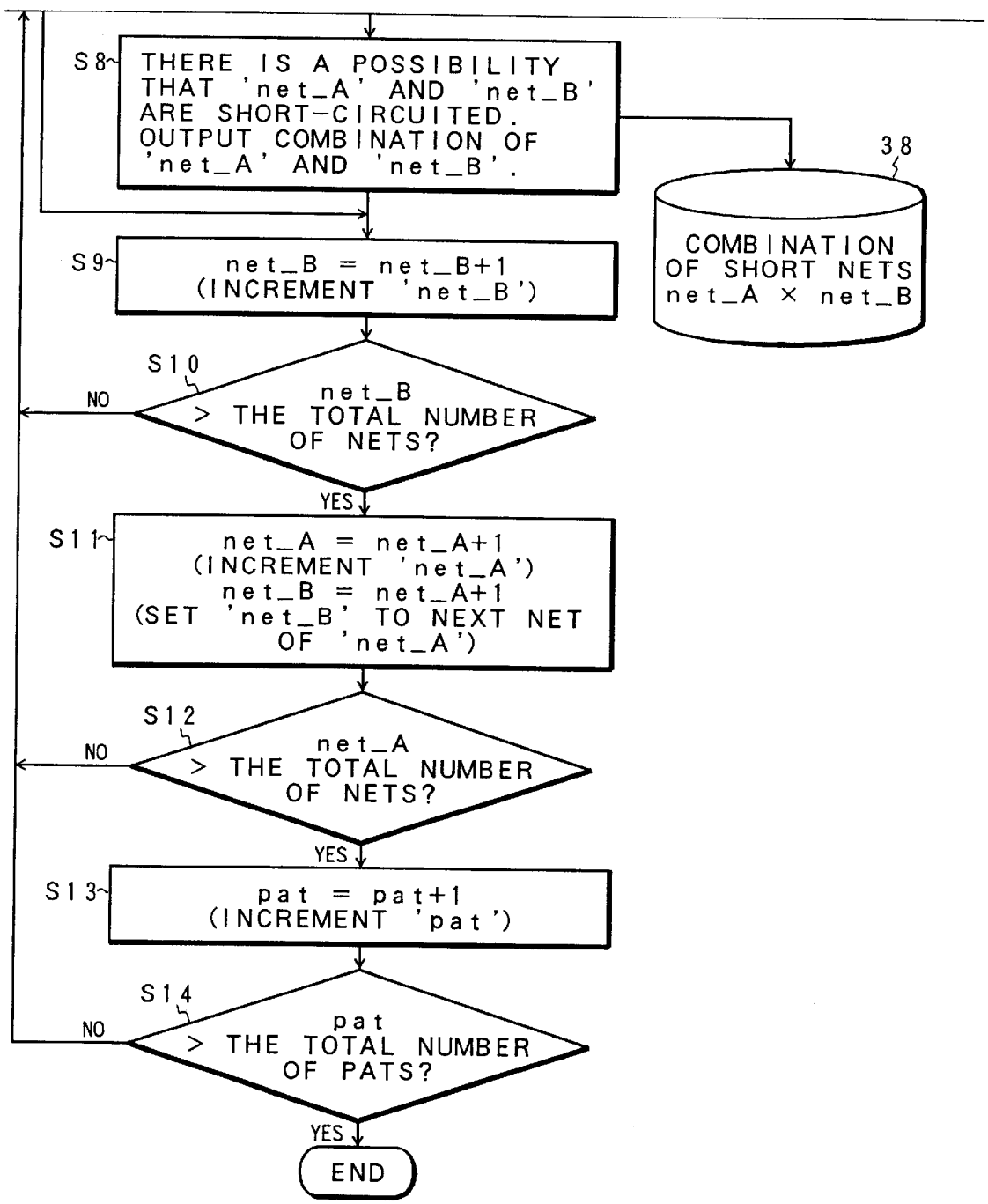

FIGS. 6A and 6B are flowcharts for the short-circuit failure diagnosing process of the invention and show an analyzing algorithm for realizing the formation of the state value variables in FIG. 3, the failure discrimination by the comparison of the pass patterns in FIG. 4, and the failure discrimination by the comparison of the fail patterns in FIG. 5, respectively. In FIG. 6A, first in step S1, the state value of the net prepared prior to the analyzing process and the device test result using the Iddq measurement pattern are read, respectively. Subsequently, in step S2, the net state value 0 or 1 is substituted into the state value variable "netdata (n, p)" of each net and the test result of each Iddq measurement pattern is substituted into each bit of the test result variable "passdata (p)", respectively. In step S3, "net_A" is set to the net No. 1, "net_B" is set to the net No. 2, and further, the pattern No. "pat" of the Iddq measurement pattern is set to 1. They are the set states of the variable values shown in the variable forming table 30 in FIG. 3, namely, the states of (netdata_1)=0, (netdata_2)=0, and (passdata)=1. In step S4, with respect to the two nets A and B set in step S3 and the first one measurement pattern, the pass patterns P_A and P_B are obtained by the AND of each of the state value variables "netdata (net_A), netdata (net_B)" and the test result variable (passdata). Whether they are equal or not is discriminated in step S5. If they are equal, it is determined that there is a possibility of the short-circuit between the two nets. A comparing process of the fail patterns in step S6 is performed. As for the comparing process of the fail pattern, if the logical values of the two nets are equal in step S7, step S8 follows and it is determined that there is a possibility of the short-circuit between the nets A and B, and the combination (net_A× net_B) of them is outputted and stored in the diagnosis result storing file 38. If a comparison result of the pass patterns or a comparison result of the fail patterns indicates the dissidence of the patterns in step S5 or S7, step S9 in FIG. 6B follows. The net B is incremented by 1 so as to become the next net. If the comparison is not finished yet in step S10 with respect to all nets, the processing routine is returned to step S4 in FIG. 6A. The short-circuit failure by the comparisons of the pass patterns and the fail patterns is discriminated with respect to the net A and the newly incremented net B. If the number of the net B exceeds the total number of nets in step S10 in FIG. 6B, step S11 follows. The net A is subsequently incremented by 1 and, at the same time, the net B is updated to the net in which 1 is added to the incremented net A. For example, if the net A is initially equal to 1 (net A=1), the net A is incremented to (A=1+1=2) and, at this time, the net B is incremented to (B=2+1=3). In step S12, if the number of the net A does not reach the total number of nets, the processing routine is returned to step S4 in FIG. 6A and similar processes are repeated. If the number of the net A coincides with the total number of nets in step S12, since it means that the process is finished with respect to all nets about the Iddq measurement pattern in this instance, the measurement pattern (pat) is incremented by 1 in step S13. Until the number of the measurement pattern (pat) reaches the total number of nets in step S14, the processes in step S4 and subsequent steps are repeated. Thus, according to the flowchart for the short-circuit failure analyzing process in FIGS. 6A and 6B, for example, assuming that the number n of nets is equal to n=01 to 08 and the measurement patterns are set to pat=1 to 6, the variable forming process and the discriminating processes of the short-circuit failure by the comparison of the pass patterns and the comparison of the fail patterns in FIGS. 3 to 5 are sequentially performed while increasing the net number and the pattern number, so that substantially the same processing results as those in case of comparing the whole circuit can be obtained.

Figure 7A:

FIGS. 7A and 7B are explanatory diagrams for the variable forming process for grouping the nets having the same state value variables. FIG. 7A shows the variable forming table 30 formed by the variable forming unit 28 in FIG. 1. In the variable forming table 30, as for the net Nos. NET01 to NET10 and the Iddq measurement patterns PAT1 to PAT6, the internal state value 0 or 1 is substituted into each of the state value variables (netdata_n)_1 to (netdata_n)_10 and, further, the test result variable (passdata) in which the test results obtained with regard to the Iddq measurement patterns PAT1 to PAT6 have been substituted are substituted. The state value variables (netdata_1) and (netdata_9) of the net Nos. 01 and 09 have the same logical value "000110". The state value variables (netdata_2) and (netdata_10) of the net Nos. 02 and 10 have the same logical value "010100". Therefore, as shown in FIG. 7B, the nets having the state value variables of the same logical value are grouped. That is, the nets of the net Nos. 01 and 09 are grouped into the group G01 and the nets of the net Nos. 02 and 10 are grouped into the group G02. In the case where a plurality of nets are grouped as mentioned above, one state value variable in each of the groups G01 and G02 is taken out as a representative value and the comparisons of the pass patterns and the fail patterns for discriminating the short-circuit failure are performed.

Figure 8A:
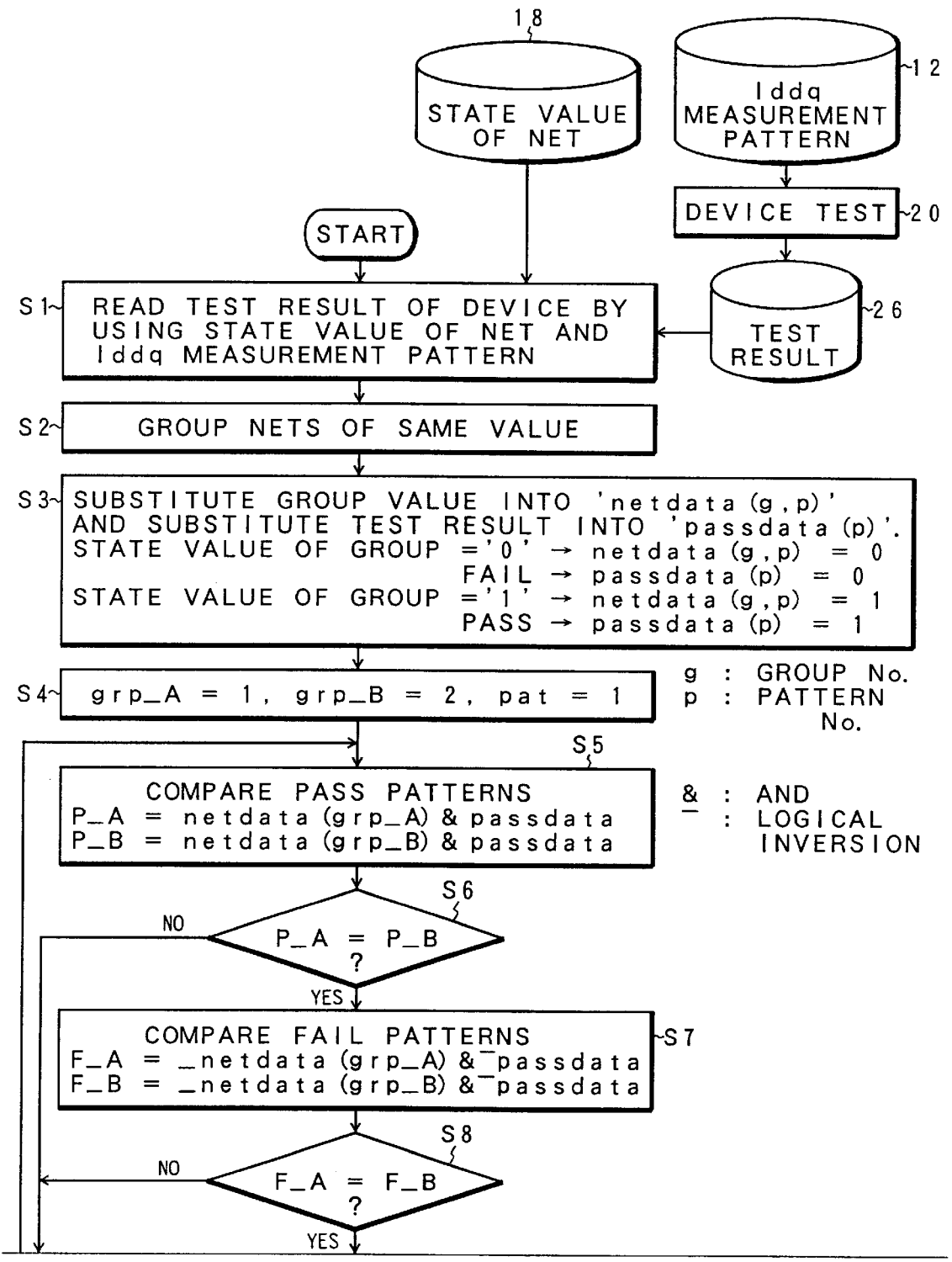
FIGS. 8A and 8B are flowcharts for the short-circuit failure analyzing method of the invention in the case where the nets of the same values are grouped in FIGS. 7A and 7B.
Figure 8B:
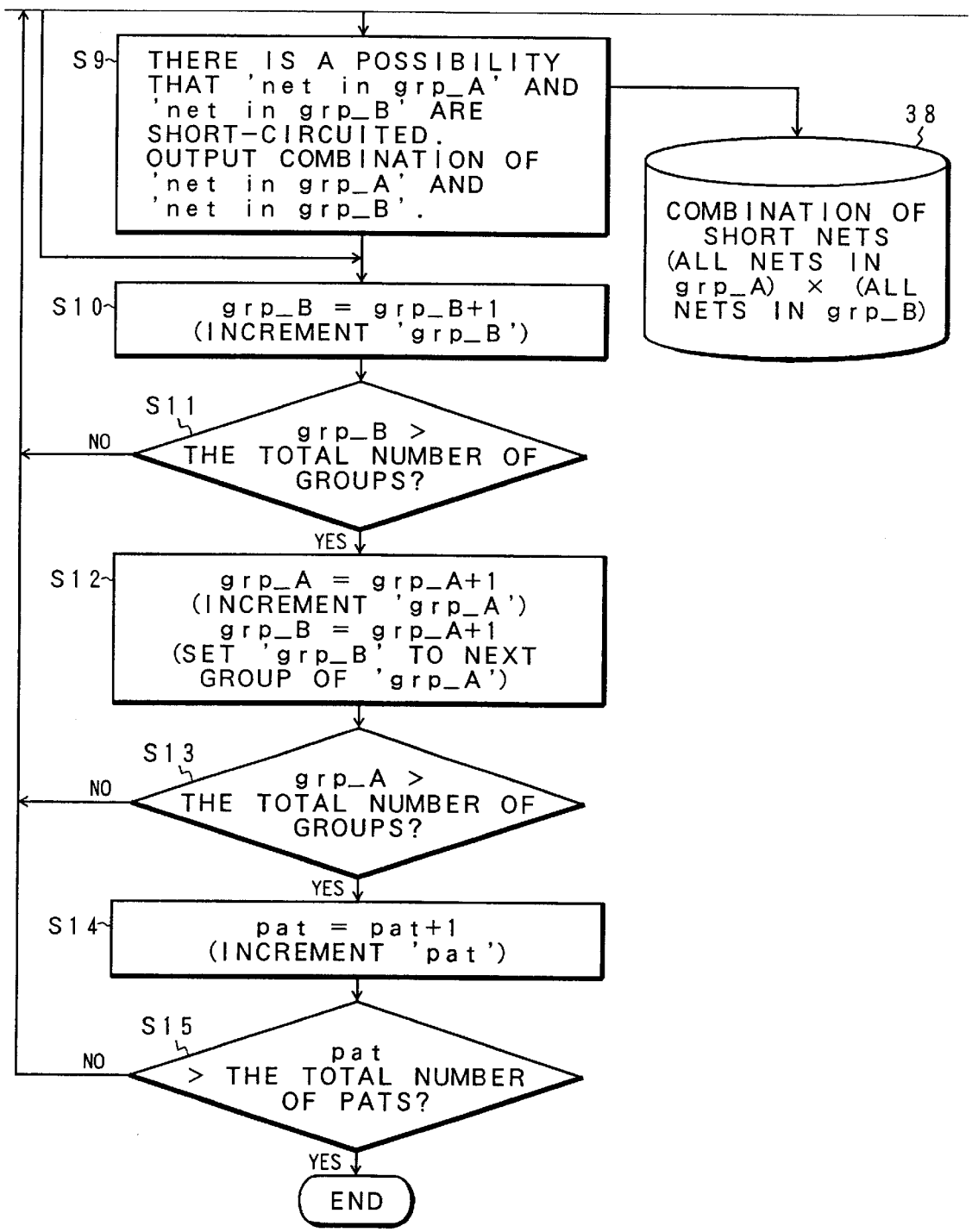

FIGS. 8A and 8B are flowcharts for a short-circuit failure analyzing process according to the invention in the case where the nets having the same logical values are grouped. In the flowchart, they are grouped in step S2. Although the group Nos. G01 and G02 are set as shown in FIG. 7B in association with such a grouping process, continuous group Nos. G03 to G08 are also allocated to the nets of the net Nos. 03 and 08 which are not grouped. Subsequently, in step S3, the state value variables are handled as variables (netdata_g, p) defined by a group No. g and a measurement pattern No. p. Thus, the number of state value variables in FIG. 7A can be reduced from 10 corresponding to the number of nets to 8 due to the grouping process. The number of processes for the short-circuit failure based on the comparison of the pass patterns and the comparison of the fail patterns in step S4 and subsequent steps can be reduced and the analyzing speed can be raised. The processes in steps S4 to S15 in FIGS. 8A and 8B are substantially the same as those in FIGS. 6A and 6B except for a different point that the nets A and B in steps S3 to S14 in FIGS. 6A and 6B are replaced with the group Nos. (grp_A, grp_B).

FIGS. 9A and 9B are explanatory diagrams of the variable forming table and a mask table which are used in the short-circuit failure analyzing process in the case where the internal state including the unsteady state X and high impedance state Z are derived when the internal state value is derived by the internal state value deriving unit 16 provided for the simulator 14 in FIG. 1 by supplying the Iddq measurement patterns. That is, with respect to the internal state of the logic circuit which is determined by supplying the Iddq measurement patterns by the simulation, there is a case where the unsteady state X in which 0 or 1 is not determined and the high impedance state Z of a driver output are obtained. In case of presuming the short-circuit failure from the state value of each net including the unsteady state X and high impedance state Z and the test result of the Iddq test as mentioned above, in addition to the variable forming table 30 in FIG. 9A in which the state value variables in which 0 or 1 of the unsteady state has been substituted is obtained every net, a mask table 42 in which mask variables have been substituted every net as shown in FIG. 9B is formed. In the mask table 42, mask variables (maskdata_1 to maskdata_8) are set with respect to the net Nos. NET01 to NET08 and Iddq measurement patterns PAT1 to PAT6. First, in the variable forming table 30 in FIG. 9A, the high impedance state Z=0 is substituted at the position of the pattern No. PAT=5 and the net No. NET=02, and the unsteady state X=1 is substituted at the position of the pattern No. PAT=4 and the net No. NET=06. In the mask table 42 in FIG. 9B, 1 is substituted as a mask value with respect to 0 or 1 in which the state value shows the decision state in the variable forming table in FIG. 9A and a mask value 0 is substituted as for the unsteady state X and high impedance state Z. As mentioned above, in the analyzing process of the short-circuit failure in the case where the unsteady state X and high impedance state Z are included in the internal state value, three kinds of variables of the state value variable of each network, the mask variable, and the test result variable are used in the logical arithmetic operation for obtaining the pass patterns and fail patterns.

First, the pass patterns P_A and P_B in case of performing the analysis for the nets A and B are obtained by the following logical arithmetic operations.

$$K\_A = netdata\_A \ \& \ maskdata\_A \ \& \ maskdata\_B \ \& \ passdata \quad (7)$$

$$K\_B = netdata\_B \ \& \ maskdata\_A \ \& \ maskdata\_B \ \& \ passdata \quad (8)$$

For the purpose of comparison of the fail patterns, the first fail pattern K_A and the second fail pattern K_B are obtained as follows with respect to the two nets A and B.

$$K\_A = netdata\_A \ \& \ maskdata\_A \ \& \ maskdata\_B \ \& \ passdata \quad (9)$$

$$K\_B = \overline{netdata\_B} \ \& \ maskdata\_A \ \& \ maskdata\_B \ \& \ passdata \quad (10)$$

Figure 10A:
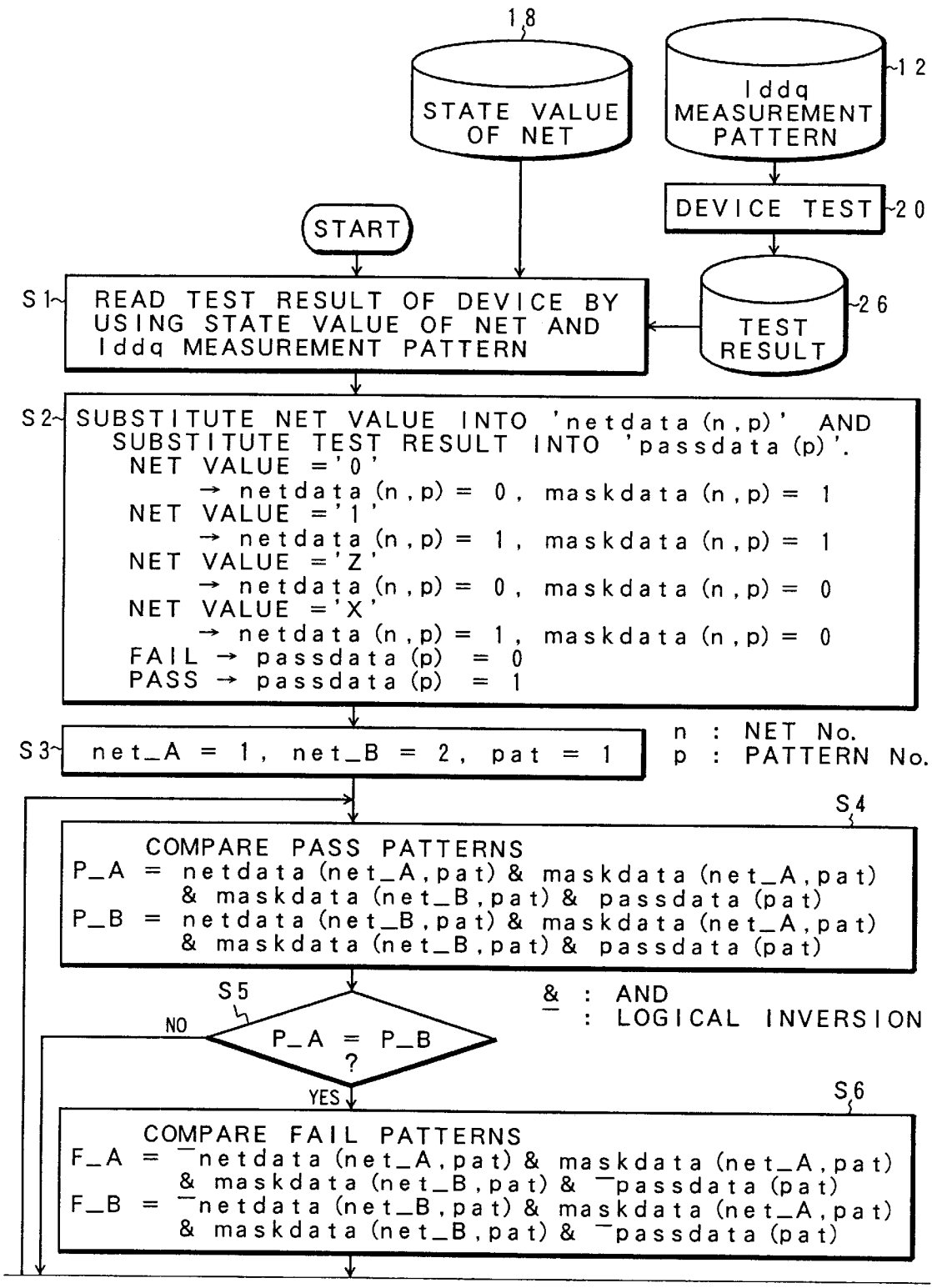
FIGS. 10A and 10B are flowcharts for the short-circuit failure analyzing method of the invention in the case where the unsteady state X and high impedance state Z are included in FIGS. 9A and 9B.
Figure 10B:
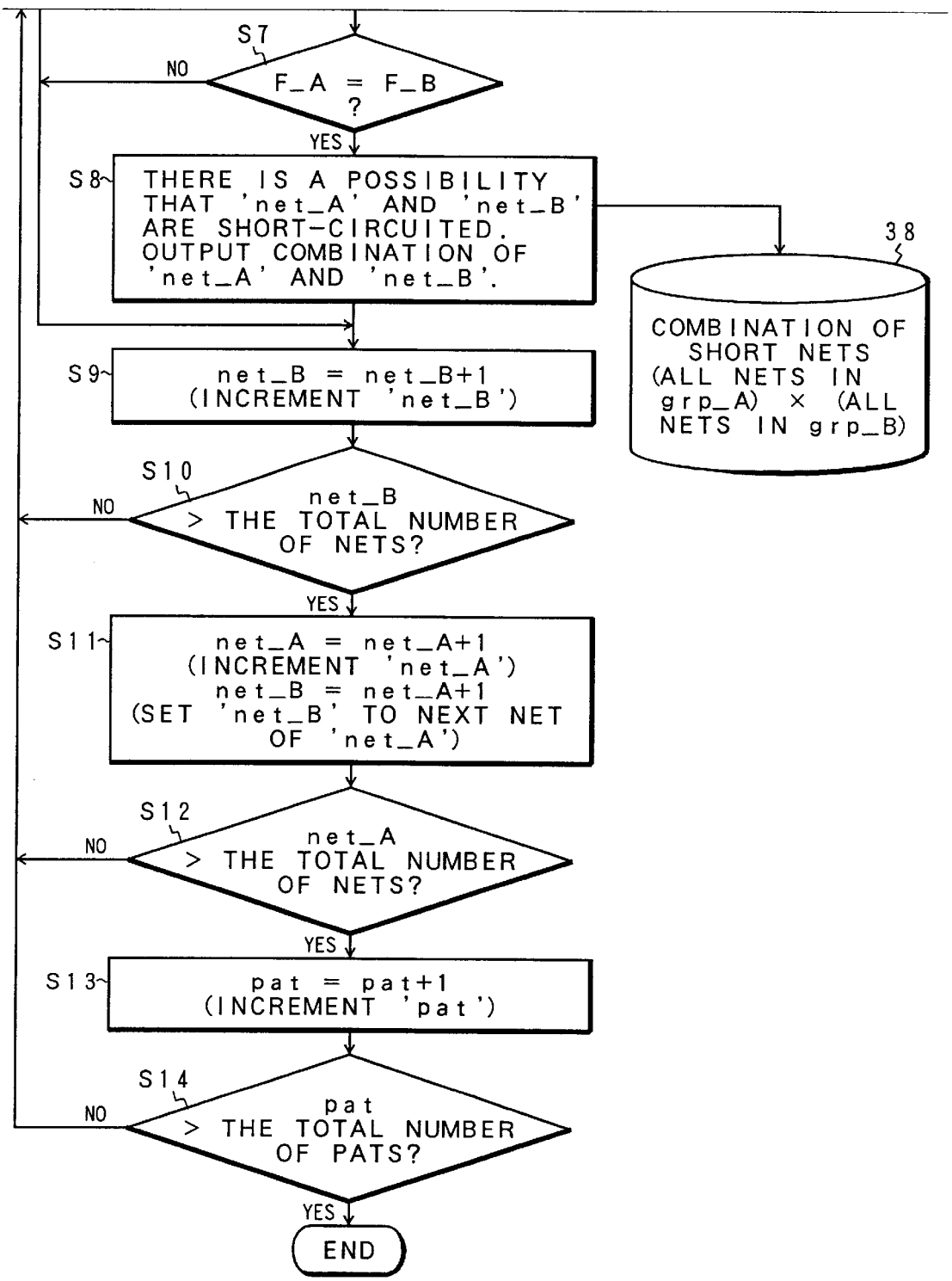

FIGS. 10A and 10B are flowcharts for a short-circuit failure analyzing process according to the invention in the case where the unsteady state X and high impedance state Z exist in the state values of the net as shown in FIGS. 9A and 9B. In this process, after the information necessary for analysis was read in step S1, the decision state 0 or 1 and the state values including the unsteady state X and high impedance state Z are substituted into the variable forming table 30 shown in FIG. 9A and, further, the mask values for the mask variables are substituted into the mask table 42 in FIG. 9B in step S2. Subsequently, after the net numbers and the measurement pattern numbers (pat) were initial-set with regard to the two nets A and B in step S3, the pass patterns are compared in step S4. In the comparison of the pass patterns, logical arithmetic operations of the equations (7) and (8) in which the mask variables (maskdata_n) in which 0 has been substituted in the unsteady state X and high impedance state Z are combined with the pass patterns (P_A, P_B) of the nets A and B are executed. If the pass patterns of the nets A and B are equal in step S5, it is determined that there is a possibility that there is a short-circuit failure in the nets A and B. Fail patterns are compared in step S6. In the comparison of the fail patterns, AND arithmetic operations of the equations (9) and (10) in which the mask variables (mask_n) of the nets are combined with the arithmetic operations of the fail patterns (F_A) and (F_B) are executed. If the fail patterns are equal in step S7, it is determined in step S8 that there is a possibility that there is a short-circuit failure in the nets A and B, and the combination of the short-circuited nets is stored in the analysis result storing file 38. Subsequently, processes in steps S9 to S14 in FIG. 10B are executed. However, those processes are substantially the same as those in FIGS. 6A and 6B. The processes are repeated with respect to the total number of nets and the total number of patterns while incrementing the numbers of the nets A and B and the measurement patterns.

Figure 11A:
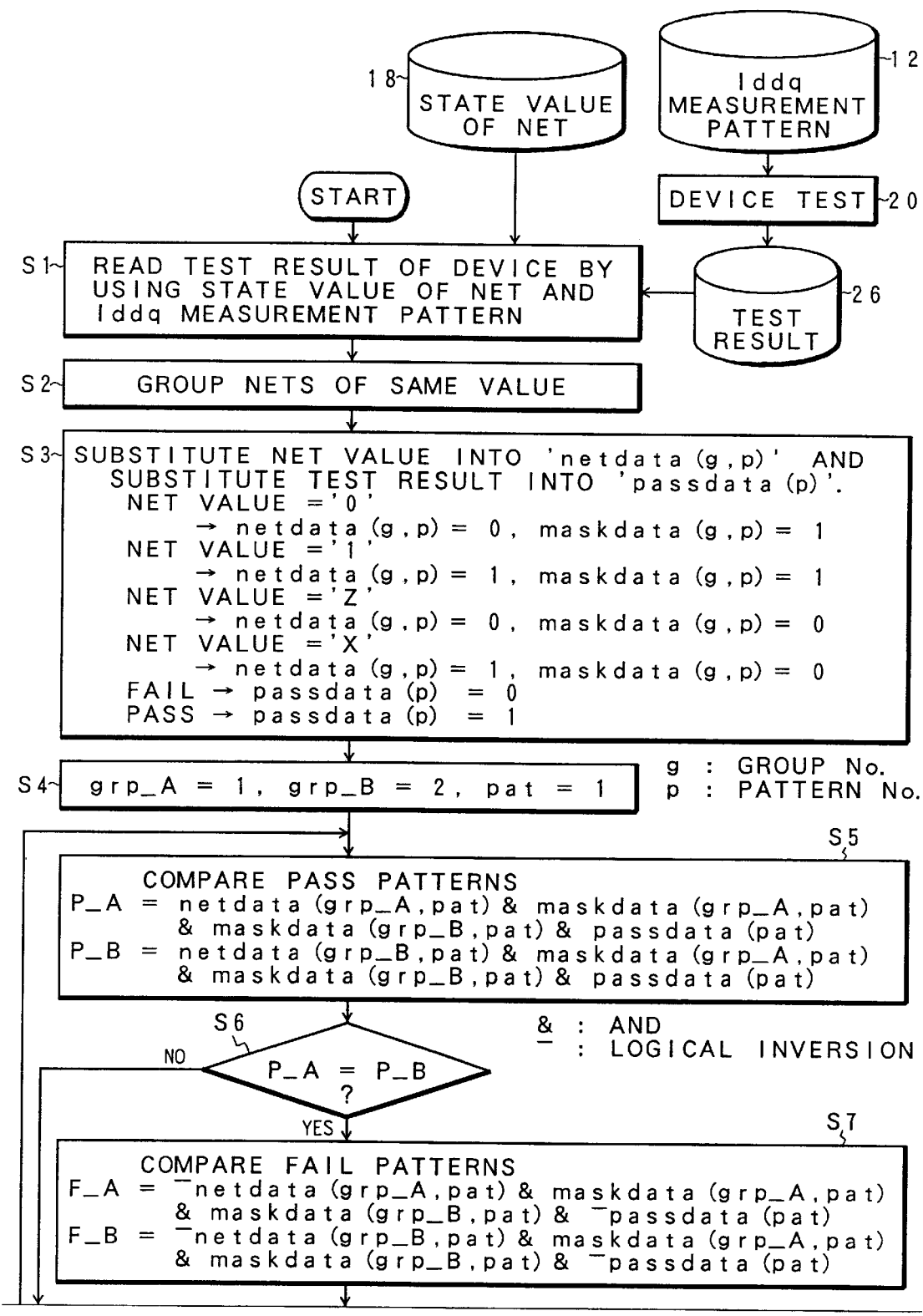
FIGS. 11A and 11B are flowcharts for the short-circuit failure analyzing method of the invention in the case where the unsteady state X and high impedance state Z are included and the nets of the same values are grouped.
Figure 11B:
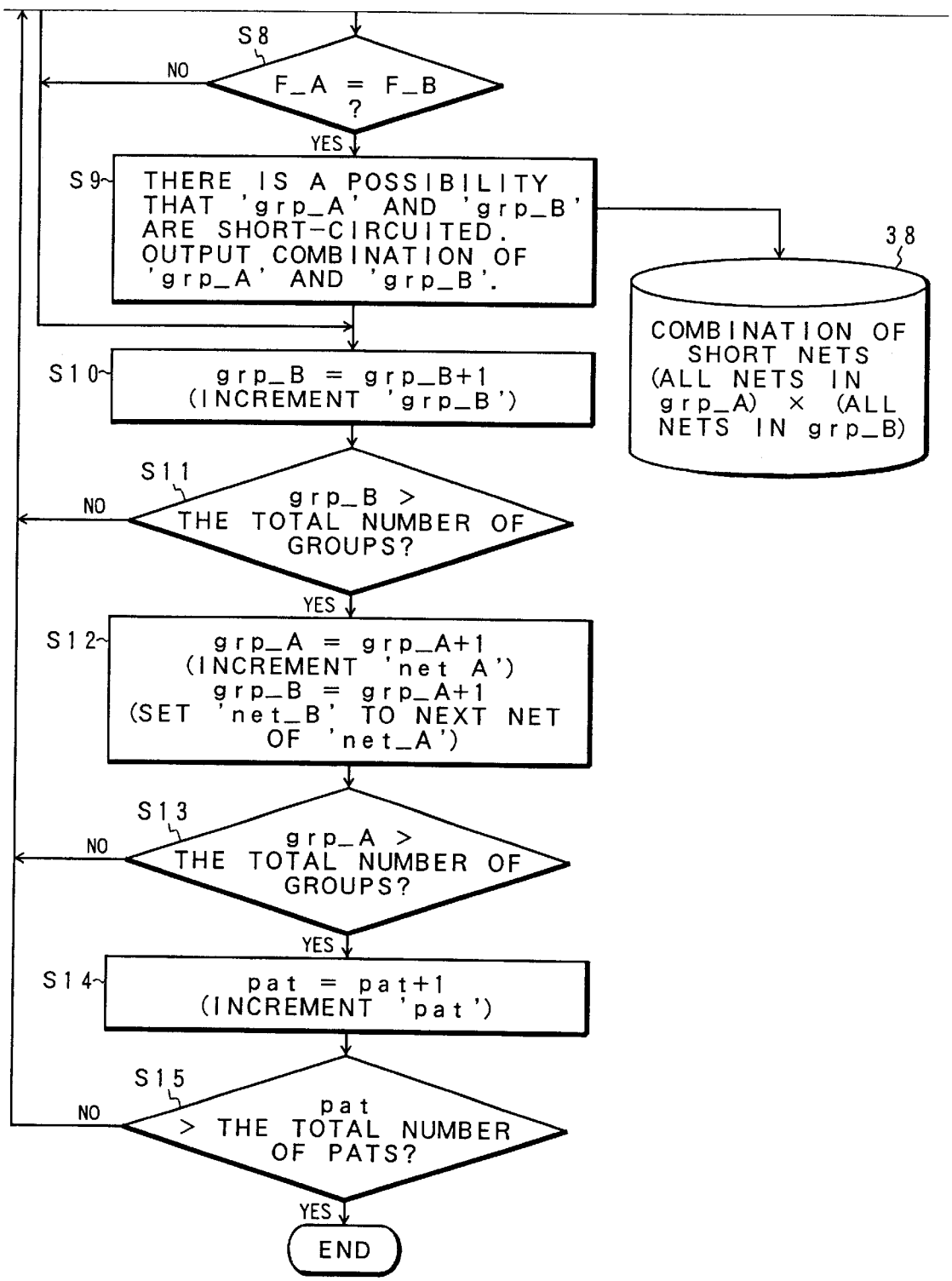

Flowcharts of FIGS. 11A and 11B are characterized in that the net state value functions having the same value are grouped and processed with respect to the case where the unsteady state X and high impedance state Z are included in the net state values in FIGS. 10A and 10B. That is, in step S2 in FIG. 11A, for example, if the same value exists in the state value variables (netdata_n) of the variable forming table 30 formed as shown in FIG. 9A, the nets having the same value are grouped as shown in FIG. 7B and the group Nos. G01, G02, . . . are set in addition to the nets of the net numbers which are not grouped. Processes in step S3 and subsequent steps differ from those in FIGS. 8A and 8B with respect to a point that the group Nos. (grp_A) and (grp_B) are used in place of the net Nos. (net_A) and (net_B) in FIGS. 8A and 8B. The other processes are the same as the analyzing process of the short-circuit failure by the comparison of the pass patterns and the comparison of the fail patterns.

An embodiment of the convergence processing unit 40 in FIG. 1 will now be described. A converging process by the convergence processing unit 40 is executed in the case where it is determined by the short-circuit failure analyzing process of the invention that there are many specific positions of the short-circuited nets in a state where the combination of the short-circuited nets has been stored in the analysis result storing file 38 and the failure positions cannot be sufficiently decided. The convergence processing unit 40 first allows the measurement pattern forming unit 10 to form an Iddq measurement pattern such that the failure positions which are left at present can be separated, allows the internal state value deriving unit 16 in the simulator 14 to derive the internal state value with respect to the newly measured Iddq measurement pattern, and allows the quiescent power source current testing unit 22 of the device testing apparatus 20 to perform a test, thereby obtaining a test result. With respect to the net state value and test result which were newly obtained, the state value of each net is substituted into the new measurement pattern by he variable forming unit 28, the test result is substituted into the position of the new measurement pattern, processes for comparison of the pass patterns and comparison of the fail patterns are executed in the discriminating unit 32, and the combination of the short-circuited nets is converged. If there are still many short-circuited nets and the failure position cannot be sufficiently decided even if the convergence processing unit 40 performs a convergence at the first stage as mentioned above, whether the failure positions converged by the state values of the nets and the test result are close enough to be short-circuited or not is discriminated with reference to the wiring position information obtained from the design data of the integrated circuit 24. If the failure positions are close enough to be short-circuited, they are converged as a failure position. That is, there is a case where the state values of the nets are the same for all of the Iddq measurement patterns in the integrated circuit. In such a case, the failure position cannot be decided if only the state values of the nets are used. For example, the nets whose state value variables are the same when they are formed are grouped and in the case where it is presumed that Na nets are included in a group Ga, Na nets are included in a group Gb, and the groups Ga and Gb are short-circuited in this instance, (Na×Nb) short-circuit positions exist as presumed short-circuit positions.

It is necessary to converge such many presumed short-circuit positions up to a few positions in order to analyze a failure. Therefore, by extracting a combination of the nets which are close enough to be short-circuited with reference to the wiring positions of each net included at the (Na×Nb) presumed short-circuit positions, the failure position which cannot be decided if only the state values of the nets are used can be converged.

As described above, according to the invention, the logical state value in all measurement patterns of each net in the simulation are substituted into one state value variable on a net unit basis, the results of the quiescent power source current tests of all nets in all of the measurement patterns are substituted into another one test result, the test result variable and the internal state value variable of each net are combined, and they are mutually compared between the nets, so that the short-circuit failure position can be decided. The short-circuit failure position can be decided by repeating the logical arithmetic operations and comparisons of the state value variables of the number as many as the number of nets and the variable of the test result of one quiescent power source current test. Therefore, even in a large scale integrated circuit having, for example, millions of gates or more, the short-circuit failure can be analyzed at a high speed in a practical processing time. By grouping the nets in which the values substituted into the variables of the internal state values of all nets are the same, the number of variables which are used in the logical arithmetic operation of the comparing process can be reduced and the short-circuit failure can be decided at a high speed. Further, even if the unsteady state and high impedance state exist as net internal states, by combining the mask variables showing the unsteady state and high impedance state, even when the unsteady state and high impedance state exist in the internal logical states, an analysis for deciding the short-circuit failure position can be performed. Further, with respect to the short-circuit failure position obtained from the internal state value variable of each net and the test result variable of the quiescent power source current test, the measurement pattern of the quiescent power source current test is newly formed and analyzed again as necessary or a convergence to decide the short-circuit failure position is performed by using the wiring position information. Thus, the short-circuit failure positions can be accurately converged to a few positions.

The invention incorporates all of modifications without losing the objects and advantages of the invention. The invention is not limited by the numerical values shown in the embodiment.

What is claimed is:

1. A short-circuit failure analyzing method of an integrated circuit comprising:

changing a setting of an internal logical state of the integrated circuit and forming a plurality of measurement patterns which are used in a quiescent power source current test;

deriving an internal state value of each net at the time when the measurement patterns are supplied by a simulation of the integrated circuit;

measuring a quiescent power source current by supplying the plurality of measurement patterns to the integrated circuit which has been determined to be a defective device, and obtaining a pass or fail test result for every one of the measurement patterns;

forming a state value variable in which the internal state values of all of the measurement patterns have been stored for every net and a test result variable in which the pass or fail test result has been stored for every one of the measurement patterns on the basis of the measurement patterns, internal state values, and test results; and comparing the state value variable of each net with the test result variable and discriminating a combination of the short-circuited nets in the integrated circuit as failure positions, said comparing comprising:

obtaining a pass pattern of each net by the AND of the state value variable of each net and the test result variable, and presuming that a short-circuit position exists between the nets whose pass patterns have a same logical value; and obtaining a first fail pattern of each net by the AND of the state value variable of each net and an inverted value of the test result variable with respect to a plurality of nets in which the existence of the short-circuit position has been presumed, obtaining a second fail pattern of each net by the AND of an inverted value of the state value variable of each net and the test result variable, presuming that a short-circuit position exists between the nets in which the first fail patterns and the second fail patterns of the two nets mutually have a same logical value, and outputting a presumption result.

2. A method according to claim 1, wherein in said forming a state value, the state value variables of a plurality of nets having a same value are collectively grouped into one group, and in said comparing, the state value variable of an arbitrary representative net is selected from the group of state value variables, thereby discriminating a short-circuit failure.

3. A method according to claim 1, wherein in said forming a state value, in the case where an unsteady state and a high impedance state are included in an internal state of each net, a mask variable in which "1" has been stored in a decision state of said state value variable and "0" has been stored in the unsteady state or high impedance state is formed besides the state value variable of every said net, and in said comparing, the state value variable of each net, the mask variable of each net, and the test result variable are compared, thereby discriminating a short-circuit position in said integrated circuit.

4. A method according to claim 3, wherein said comparing comprises:

obtaining a pass pattern of each net by the AND of the state value variable of each net, its own and comparison destination's mask variables of each net, and the test result variable and presuming that the short-circuit position exists between the nets in which the pass patterns have a same logical value; and obtaining a first fail pattern of each net by the AND of the state value variable of each net, its own and comparison destination's mask variables of each net, and an inverted value of the test result variable with respect to a plurality of nets in which the existence of said short-circuit position has been presumed, obtaining a second fail pattern of each net by the AND of an inverted value of the state value variable of each net, its own and comparison destination's mask variables of each net, and the inverted value of the test result variable, presuming that a short-circuit position exists between the nets in which the first fail patterns and the second fail patterns of the two nets mutually have a same logical value, and outputting a presumption result.

5. A method according to claim 1, wherein in said forming, the state value variables of a plurality of nets having a same value are collectively grouped into one group, and in said comparing, the state value variable of an arbitrary representative net is selected from said group of state value variables, thereby discriminating a short-circuit position.

6. A method according to claim 1, wherein in the case where it is necessary to further converge the short-circuit failure positions obtained in said comparing, in said changing, a measurement pattern of the quiescent power source current test which can separate the failure positions as convergence targets is formed, and said deriving, said measuring, and said comparing are executed again, thereby deciding a short-circuit failure position.

7. A method according to claim 1, wherein as for the converged short-circuit failure positions, whether the short-circuit failure positions are close enough to be short-circuited or not is discriminated with reference to position information of wirings, thereby further converging the short-circuit failure positions.

8. A short-circuit failure analyzing apparatus for deciding a short-circuit failure position of an integrated circuit, comprising:

a measurement pattern forming unit changing a setting of an internal logical state of said integrated circuit and forming a plurality of measurement patterns which are used in a quiescent power source current test;

an internal state value deriving unit deriving an internal state value of each net at the time when said measurement patters are supplied by a simulation of said integrated circuit;

a testing unit measuring a quiescent power source current by supplying said plurality of measurement patterns to the integrated circuit which has been determined to be a defective device and obtaining a pass or fail test result for every said measurement pattern;

a variable forming unit forming a state value variable in which the internal state values of all of the measurement patterns have been stored for every net and a test result variable in which the pass or fail test result has been stored for every said measurement pattern on the basis of said measurement patterns, internal state values, and test results;

a discriminating unit comparing the state variable of each net with the test result variable and discriminating a combination of the short-circuited nets in the integrated circuit as failure positions;

a pass pattern comparing unit obtaining a pass pattern of each net by the AND of the state value variable of each net and the test result variable, and presuming that a short-circuit position exists between the nets whose pass patterns have a same logical value; and a fail pattern comparing unit obtaining a first fail pattern of each net by the AND of the state value variable of each net and an inverted value of the test result variable with respect to a plurality of nets in which the existence of the short-circuit position has been presumed, obtaining a second fail pattern of each net by the AND of an inverted value of the state value variable of each net and the test result variable, presuming that a short-circuit position exists between the nets in which the first fail patterns and the second fail patterns of the two nets mutually nave a same logical value, and outputting a presumption result.

* * * * *